US011990335B2

(12) United States Patent
Beaumont et al.

(10) Patent No.: US 11,990,335 B2
(45) Date of Patent: May 21, 2024

(54) N-CO-DOPED SEMICONDUCTOR SUBSTRATE

(71) Applicant: IVWORKS CO., LTD., Daejeon (KR)

(72) Inventors: Bernard Beaumont, Le Tignet (FR); Jean-Pierre Faurie, Valbonne (FR); Vincent Gelly, Valbonne (FR); Nabil Nahas, Mougins (FR); Florian Tendille, Mougins (FR)

(73) Assignee: IVWORKS CO., LTD., Daejeon (KR)

( * ) Notice: Subject to any disclaimer, the term of this patent is extended or adjusted under 35 U.S.C. 154(b) by 310 days.

(21) Appl. No.: 17/415,921

(22) PCT Filed: Dec. 18, 2019

(86) PCT No.: PCT/EP2019/086123
§ 371 (c)(1),
(2) Date: Jun. 18, 2021

(87) PCT Pub. No.: WO2020/127605
PCT Pub. Date: Jun. 25, 2020

(65) Prior Publication Data
US 2022/0068641 A1      Mar. 3, 2022

(30) Foreign Application Priority Data

Dec. 21, 2018   (FR) ........................... 1873952

(51) Int. Cl.
*H01L 29/15*   (2006.01)
*C30B 25/02*   (2006.01)
(Continued)

(52) U.S. Cl.
CPC ........ *H01L 21/02389* (2013.01); *C30B 25/02* (2013.01); *C30B 29/403* (2013.01); *H01L 21/0254* (2013.01); *H01L 29/2003* (2013.01)

(58) Field of Classification Search
CPC ........... H01L 21/02389; H01L 21/0254; H01L 29/2003; H01L 21/02378; H01L 21/024;
(Continued)

(56) References Cited

U.S. PATENT DOCUMENTS

| 8,110,484 B1 | 1/2012 | Wu et al. |
| 2002/0168844 A1 | 11/2002 | Kuramoto et al. |

(Continued)

FOREIGN PATENT DOCUMENTS

| JP | 2002-270516 A | 9/2002 |
| JP | 2002-343728 A | 11/2002 |

(Continued)

OTHER PUBLICATIONS

International Search Report and Written Opinion for corresponding International Application No. PCT/EP2019/086123, dated Feb. 24, 2020.

(Continued)

*Primary Examiner* — Niki H Nguyen
(74) *Attorney, Agent, or Firm* — MARSHALL, GERSTEIN & BORUN LLP

(57) ABSTRACT

A process for fabricating a single-crystal semiconductor material of group 13 nitride, in particular GaN, including the steps of:
  deposition of at least one single-crystal layer by three-dimensional epitaxial growth on a starting substrate, the layer including areas resulting from the growth of basal facets, and areas resulting from the growth of facets of different orientations, called non-basal facets;
  supply of an n-dopant gas including a first chemical element selected from the chemical elements of group 16 of the periodic table, and at least one second chemical element selected from the chemical elements of group 14 of the periodic table, such that the con-
(Continued)

centration of the second element in the areas resulting from the growth of the basal facets is higher than $1.0 \times 10^{17}/cm^3$, and the concentration of the first element in the areas resulting from the growth of the non-basal facets is lower than $2.0 \times 10^{18}/cm^3$.

14 Claims, 7 Drawing Sheets

(51) Int. Cl.
  *C30B 29/40* (2006.01)
  *H01L 21/02* (2006.01)
  *H01L 29/20* (2006.01)
  *H01L 31/0256* (2006.01)

(58) Field of Classification Search
  CPC .......... H01L 21/0242; H01L 21/02458; H01L 21/02576; C30B 25/02; C30B 29/403
  See application file for complete search history.

(56) References Cited

U.S. PATENT DOCUMENTS

| | | |
|---|---|---|
| 2003/0017685 A1 | 1/2003 | Usui et al. |
| 2009/0050915 A1 | 2/2009 | Yamamoto |
| 2012/0126371 A1* | 5/2012 | Sato .................. H01L 21/02664 |
| | | 257/E29.107 |
| 2017/0338112 A1 | 11/2017 | Iso et al. |

FOREIGN PATENT DOCUMENTS

| | | |
|---|---|---|
| JP | 2010-070430 A | 4/2010 |
| JP | 2014-520748 A | 8/2014 |
| WO | WO-2013/003420 A2 | 1/2013 |

OTHER PUBLICATIONS

S. Fritze et al., Applied Physics Letters 100 "High Si and Ge n-type doping of GaN doping—Limits and impact on stress" 2012 American Institute of Physics. (2012).

* cited by examiner

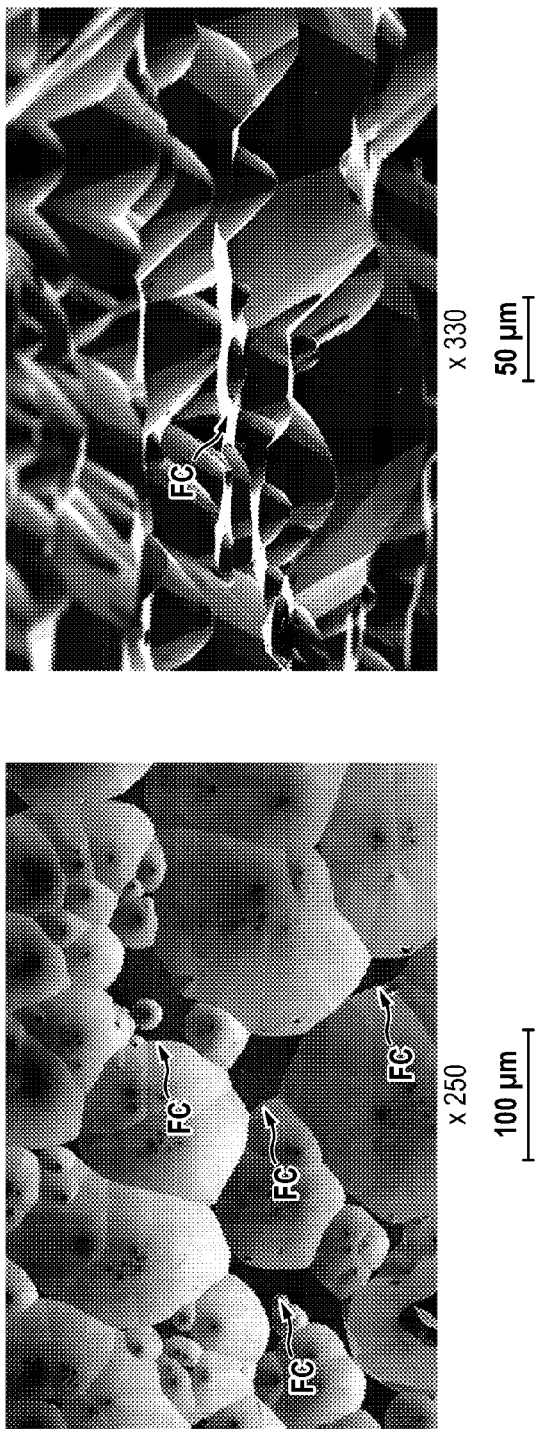

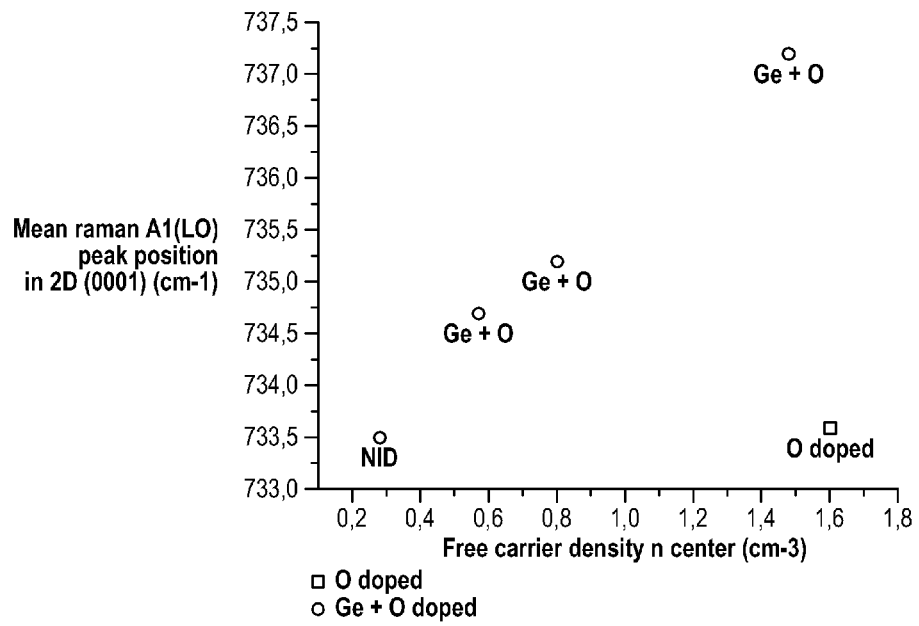
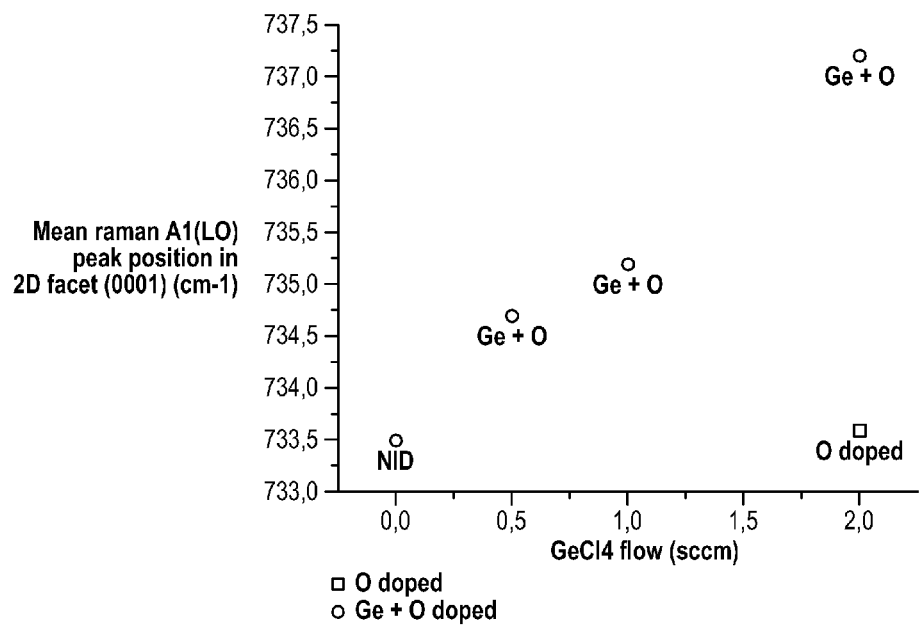

N-CO-DOPED SEMICONDUCTOR SUBSTRATE

CROSS-REFERENCE TO RELATED APPLICATIONS

This application is a U.S. national stage of International Application No. PCT/EP2019/086123 filed Dec. 18, 2019, which claims the benefit of priority of French Patent Application No. 1873952 filed Dec. 21, 2018, the respective disclosures of which are each incorporated herein by reference in their entireties.

FIELD OF THE INVENTION

The invention relates to the general technical field of fabricating substrates and wafers of a semiconductor material based on the elements of columns 13 and 15 of the periodic table—such as gallium nitride GaN.

These wafers are used as substrates for producing semiconductor structures, such as light-emitting diodes (LEDs), laser diodes (LDs), vertical transistors for power electronics, horizontal transistors for power electronics or telecommunications (radio frequency), current rectifier diodes or sensors.

BACKGROUND

Current processes for fabricating a semiconductor material substrate based on nitrides of elements of column 13 or IIIA rest on vapor deposition techniques, in particular heteroepitaxy, which consists in growing a crystal—such as a gallium nitride GaN crystal—on a starting substrate of a different nature—such as a sapphire substrate.

These methods involve an injection system from at least two different gaseous components that are capable of interacting before deposition.

Mention may be made of the well-known methods such as:
  metalorganic vapor phase epitaxy (MOVPE),
  hydride vapor phase epitaxy (HVPE),
  closed-space vapor transport (CSVT) epitaxy,
  ceramic vapor deposition, etc.

The so-called 3D growth processes or, for example, three-dimensional lateral growth allow the dislocation density to be reduced to less than $10^7/cm^2$.

Under three-dimensional growth conditions, the HVPE growth front has facets perpendicular to the growth front and facets inclined to the growth front. Regarding the facets perpendicular to the growth front, these are facets formed by the basal plane (0001). These facets are known to incorporate less oxygen than the various inclined facets (non-basal, of index hkil where $h \neq 0$ and $k \neq 0$ and $i \neq 0$). This difference in n-type doping results in areas that are more resistive than others or have different optical properties. After shaping, for example by grinding and/or polishing, to obtain a two-dimensional surface, inhomogeneity of optical and/or electrical properties can be observed.

Furthermore, the crystal lattice can have macro-inclusions with a size greater than 10 μm composed mainly of twins, domain inversions, or even polycrystallites. Doping can lead to increase the presence of such defects in the crystal lattice.

All these defects generated during growth can induce imperfections in the final wafer (doping heterogeneity and crystal defects, still high dislocation density) which will induce a failure during the fabrication of optoelectronic and/or electronic devices.

In order to improve the optoelectronic properties of the substrates, US2006255339A1 has for example disclosed an n-doped GaN crystal in a concentration of $0.7 \times 10^{18}$ to about $3 \times 10^{18}/cm^3$ while having a thermal conductivity of at least 1.5 W/cm·K so as to be able to equip devices, in particular diodes with a power of more than 1 W. Dopants such as Si, O, Ge, C can be used alone or in combination even if, in this application, only examples with Si doping have been provided.

US20110175200A1 proposes an HVPE growth process in which the crystal is doped with Ge by adding $GeCl_4$ within the reaction chamber in order to obtain a more electronically conductive crystal to compensate for the sudden increase in resistivity observed when the growth rate is higher than 450 μm/h. However, such a growth rate leads to a high surface density of macro-inclusions and a lower crystal quality.

U.S. Pat. No. 9,461,121B2 claims a process for improving the distribution of n-dopants within the GaN crystal typically by vapor phase growth by mixing the Ga and dopant input. Homogeneous incorporation into the reactor is achieved either by premixing the dopant and Ga prior to reaction with HCl or mixing the dopant and gallium halides as a single tubing within the reaction chamber. The homogeneity of dopant concentration is measured by micro-Raman, microwave-detected photoconductivity (MDP) or micro-photoluminescence. The method data indicated show that this is clearly an HVPE process with 2D growth and therefore does not provide a solution for 3D growth processes.

There is therefore a need for a group 13 or III nitride material, in particular substrates and wafers of group 13 or III nitride material, more particularly wafers and substrates composed of GaN, of great thickness, typically of thickness greater than 100 micrometers, even 400 micrometers or more, obtained under three-dimensional growth conditions, which are more homogeneous and have simultaneously:
  a low surface density of macro-inclusions, typically less than 5 $cm^{-2}$, preferably less than 4 $cm^{-2}$, or even less than 1 $cm^{-2}$,
  a better crystal quality, for example measured by the width at half-height of the X-ray diffraction (XRD) peak of the (002) line around the angle ω in symmetrical condition of the GaN (0001) planes lower than 130 arcsec, or for example the width at half-height of the X-ray diffraction (XRD) peak of the 201 line around the angle ω in oblique condition of the GaN (0001) films lower than 240 arcsec, preferably lower than 140 arcsec, and
  improved electronic properties, typically an average electrical resistivity of less than 25 mohm·cm, or even less than 20 mohm·cm.

SUMMARY OF THE INVENTION

In this regard, the invention is a process for fabricating a single-crystal semiconductor material of group 13 nitride, in particular GaN, comprising the steps of:
  deposition of at least one single-crystal layer by three-dimensional epitaxial growth on a starting substrate, said layer comprising areas resulting from the growth of basal facets, i.e., having facets perpendicular to the direction of the growth front formed by the basal plane (0001), and areas resulting from the growth of facets of different orientations, called non-basal facets, i.e., having facets which are non-perpendicular to the direction of the growth front;

supply of an n-dopant gas comprising a first chemical element selected from the chemical elements of group 16 of the periodic table, and at least one second chemical element selected from the chemical elements of group 14 of the periodic table, such that the concentration of the second element in the areas resulting from the growth of the basal facets is higher than $1.0 \times 10^{17}/cm^3$, and the concentration of the first element in the areas resulting from the growth of the non-basal facets is lower than $2.0 \times 10^{18}/cm^3$.

By way of indication, unless otherwise stated, the chemical element concentrations mentioned in the text are atomic concentrations.

Advantageously, but optionally, the process according to the invention may further comprise at least one of the following features:

The second chemical element of the n-dopant gas is germanium, formed from a solid source, $GeCl_4$, germane, tetramethylgermanium and isobutylgermane as well as derivatives thereof, and/or, the second chemical element of the n-dopant gas is silicon, formed from a solid source, silane, dichlorosilane, silicon tetrachloride, as well as derivatives thereof.

The first chemical element of the n-dopant gas is oxygen.

The oxygen supply and concentration are controlled by controlling the purity of the group III precursor and by carrying out one or more very thorough purges, at a residual pressure of less than 10 Torr, followed by one or more $N_2$ sweeps of the reactor.

In the presence of concomitant addition of dopant and oxygen according to the present invention, the concentration of n-type dopants is no longer equally distributed between the (0001) facets and the non-basal facets.

The n-dopant gas is mixed in vapor phase with a gallium chloride gas stream.

The epitaxial growth is implemented by HVPE at a growth rate lower than 450 μm/h in order to guarantee a low surface density of macro-inclusions and to ensure a satisfactory crystal quality.

The epitaxial growth is carried out by HVPE at a temperature comprised between 910° C. and 1035° C., preferably between 925 and 1015° C. Preferably the molar flow ratio of group V precursor to group III precursor is comprised between 13 and 25. Preferably, also the reactor is maintained at a residual pressure between 100 and 500 Torr. Such conditions are particularly suitable for obtaining a wafer whose atomic ratio (silicon+germanium)/oxygen variation is controlled while allowing a high atomic ratio under essentially 3D growth conditions, i.e., leading to a wafer whose growth areas, which have a surface composed of basal facets, preferably represent less than 50% or even less than 30% and preferentially from 5% to 25% of the upper surface of the wafer.

The invention also has as its object a process for fabricating a semiconductor substrate of group 13 nitride, in particular GaN, comprising the steps of:
- fabricating a single-crystal semiconductor material of group 13 nitride on a starting substrate according to the features described above,
- separating the single-crystal material from the starting substrate;
- rectifying by eliminating the thickness of the single-crystal material in order to obtain a group 13 nitride wafer with a thickness comprised between 250 μm and 2000 μm.

The invention also has as its object a two-dimensional group 13 nitride wafer, in particular of GaN, obtained by three-dimensional epitaxial growth, comprising areas resulting from the growth of basal facets, i.e., having facets perpendicular to the direction of the growth front formed by the basal plane (0001), and areas resulting from the growth of facets of different orientations, known as non-basal facets, i.e., having facets which are non-perpendicular with respect to the direction of the growth front, characterized in that:
- the areas resulting from the growth of non-basal facets comprise a first chemical element selected from the chemical elements of group 16 of the periodic table, the concentration of which is less than $2.0 \times 10^{18}/cm^3$,
- the areas resulting from the growth of basal facets comprise at least one second chemical element selected from the chemical elements of group 14 of the periodic table, the concentration of which is greater than $1.0 \times 10^{17}/cm^3$.

Advantageously, but optionally, the wafer according to the invention may further comprise at least one of the following features:

The concentration of the second element in the areas resulting from basal facet growth is greater than $2.0 \times 10^{17}/cm^3$, and the concentration of the first element in the areas resulting from non-basal facet growth is less than $1.0 \times 10^{18}/cm^3$.

The cumulative concentration of the first and second chemical elements is less than $2.0 \times 10^{19}/cm^3$, preferably less than $1 \times 10^{19}/cm^3$ or even less than $5.0 \times 10^{18}/cm^3$ in order to obtain a good electrical conductivity/resistivity and optical transparency compromise.

The second chemical element is germanium and/or silicon.

An atomic ratio (silicon+germanium)/oxygen between about 0.5 and 30, preferably between about 0.5 and 20, more preferably between about 0.5 and 15, more preferably between about 0.5 and 10, and most preferably between about 0.5 and 5.

The basal facet growth areas represent less than 60%, preferably less than 50%, or less than 30% and preferentially from 5% to 25% of the upper surface of the wafer. The surface proportion of the areas composed of basal planes can be measured along a plane c for example according to the view shown in FIG. 4c.

The crystal quality measured by the width at half-height of the X-ray diffraction (XRD) peak of the (002) line around the angle ω in symmetrical condition of the GaN (0001) planes less than 130 arcsec, preferably less than 100 arcsec, preferably less than 90 arcsec, or even less than 60 arcsec, and the width at half-height of the X-ray diffraction (XRD) peak of the 201 line around the angle ω in oblique condition of the GaN films (0001) less than 240 arcsec, preferably less than 140 arcsec, or even less than 100 arcsec.

The wafer material has an average electrical resistivity of less than 25 mohm·cm.

The polished wafer has no cracks longer than 200 micrometers, such a crack corresponding to a cleavage within the crystal.

The invention also relates to the use of a group 13 or III nitride wafer according to one of the preceding features as a substrate for the fabrication of optoelectronic and/or electronic components, such as light-emitting diodes, laser diodes, vertical transistors for power electronics, horizontal transistors for power electronics or telecommunications (radio frequency), current rectifier diodes or sensors.

DESCRIPTION OF THE DRAWINGS

Other features, purposes and advantages of the present invention will become apparent upon reading the following detailed description, with reference to the appended figures, which are given as non-limiting examples and in which:

FIGS. 4a and 4b show under these three-dimensional growth conditions, from a perpendicular or ¾ view, respectively, the growth front comprising facets along the (0001) basal plane (indicated by black arrows) that are perpendicular to the growth front of a GaN semiconductor material by HVPE in 3D mode.

FIGS. 5a and 5b respectively represent the average variation of the Raman A1(LO) peak measured by Raman spectroscopy on the (0001) faceted regions of a growth front of a GaN material by HVPE in three-dimensional mode as a function of the doping precursor and the associated free carrier density.

DETAILED DESCRIPTION

Figure 1:
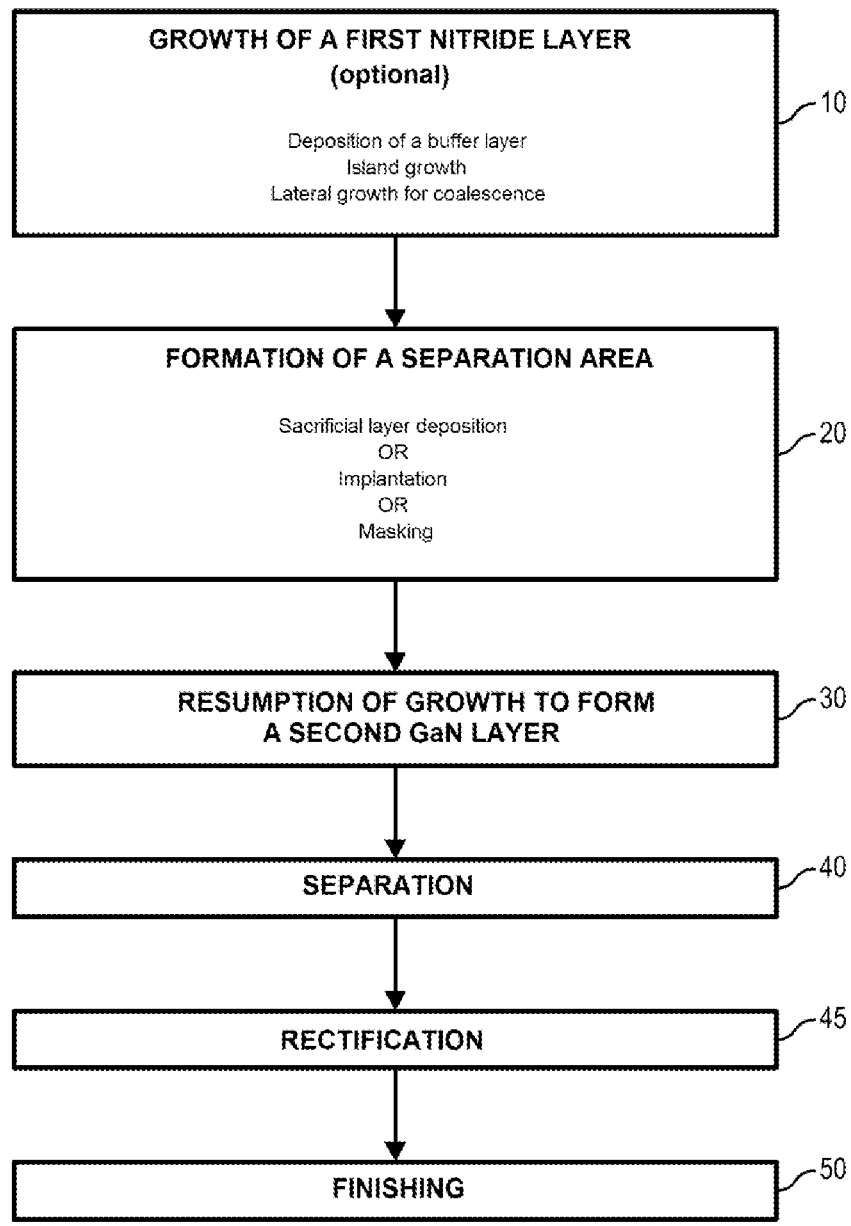
FIG. 1 summarizes the main possible steps of the substrate fabrication process according to one embodiment of the invention.
Figure 2:
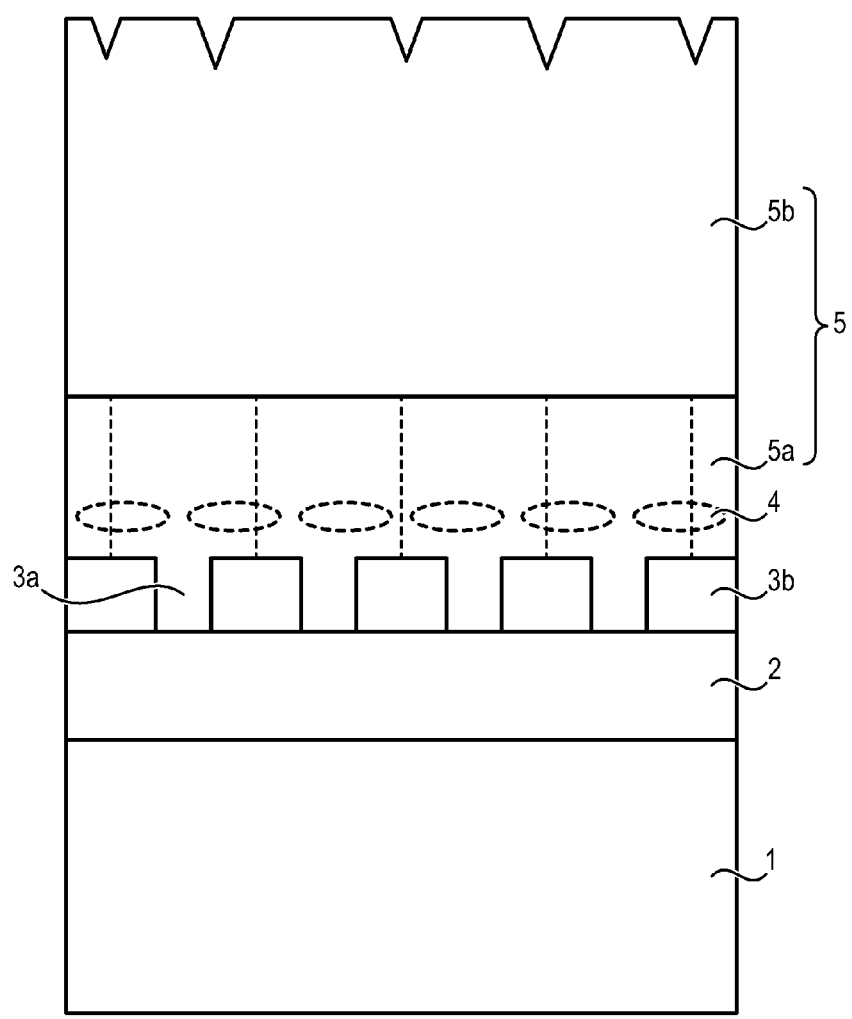
FIG. 2 schematically depicts a semiconductor material composed of a stack of layers according to one possible embodiment of the invention.

With reference to FIGS. 1, 2, the possible main phases of the GaN wafer fabrication process are illustrated.

In the following, the process according to the invention will be described with reference to the fabrication of GaN wafers.

However, it is readily apparent to the person skilled in the art that the process described below can be used to grow a material including a layer of group 13 nitride other than gallium nitride GaN.

1. Fabrication Process

The process comprises:
- an optional phase 10 of growth of a first layer of group 13 nitride, preferably GaN 5a;
- a phase 20 of formation of a separation area 4;
- a phase 30 of resumption of epitaxy to form a second thick layer of GaN 5b;
- a separation phase 40 to obtain a GaN crystal 5;
- a grinding phase 45 to remove a thickness of the second thick layer of GaN 5b;
- a finishing phase 50 to form GaN wafers from the GaN crystal 5.

1.1. Growth Phase 10

The optional growth phase 10 consists in forming a first GaN layer 5a by lateral overgrowth.

The lateral overgrowth minimizes the density of defects contained in the first GaN layer 5a.

The approach used to reduce the dislocation density in the first GaN layer 5a consists in:
- initiating an island mode of GaN growth, and then in promoting the coalescence of the islands to obtain the first GaN layer 5a.

Advantageously, the lateral overgrowth is implemented on a starting substrate 1 with a non-zero truncation angle.

Using a starting substrate 1 with a non-zero truncation angle allows a first GaN layer 5a with a non-zero truncation angle to be grown.

The starting substrate 1 may be selected from Si, AlN, GaN, GaAs, $Al_2O_3$ (sapphire), ZnO, SiC, $LiAlO_2$, $LiGaO_2$, $MgAl_2O_4$, 4H—SiC, or any other type of starting substrate known to the skilled person for implementing gallium nitride growth.

It can have a thickness of a few hundred micrometers, generally 350 micrometers.

Advantageously, the starting substrate 1 can be treated by nitriding prior to any deposition step. This improves the quality of the GaN crystal obtained.

The truncation angle can be comprised between 0.1 and 5.0 degrees, preferentially between 0.2 and 0.8 degree, and even more preferentially between 0.3 and 0.6 degree (in particular to limit stacking errors).

The growth of the first GaN layer 5a can be implemented according to different variants. In particular, the lateral overgrowth can be based:
- on the use of a dielectric mask 3a, 3b including openings 3a in which the islands are formed, as described in document WO99/20816;
- on the use of a dielectric layer without an opening on which islands form spontaneously, as described in document EP 1 338 683.

1.1.1. First Variant of Lateral Overgrowth

In a first variant, the growth phase 10 consists of an epitaxial lateral overgrowth (hereafter ELO).

The ELO includes a step of depositing a thicker planar layer 2 on the starting substrate 1.

This deposition is preferably carried out by metalorganic vapor phase epitaxy (MOVPE), for example at a temperature comprised between 500° C. and 700° C., in particular 600° C.

The deposition of a layer 2 reduces the stresses between the starting substrate 1 and the first GaN layer 5a epitaxied thereafter. Indeed, the deposition of the layer 2 on the substrate 1 ensures a "soft" transition between the substrate 1 and the first GaN layer 5a whose crystal structures are different.

The deposition of layer 2 further facilitates the subsequent separation of the GaN crystal 5, as will become apparent from the following description. The layer 2 is, for example, a GaN layer, an AlN layer, or an AlGaN layer.

In another step, a mask 3a, 3b including openings 3a is formed. The openings 3a may be points or in the form of strips and define positions for subsequent selective growth of GaN islands.

The mask 3a, 3b can be a mask made of dielectric material, such as for example $SiN_x$ ($SiN$, $Si_3N_4$, etc.) or $SiO_2$ or TiN. This minimizes the defects created at the edge of the mask and thus improves the quality of the GaN layer subsequently epitaxied thereon.

The formation of the mask 3a, 3b can be carried out by any technique known to the skilled person. For example, the formation of the mask may consist of:
- deposition of a dielectric layer 3a from gaseous silane and ammonia precursors directly on the layer 2, and
- photolithographically etching of the dielectric layer 3a to form openings 3a.

A starting substrate 1 covered with a layer 2 and a mask 3a, 3b is thus obtained. Beyond improving the quality of the first GaN layer 5a (by filtering out through defects), the mask 3a, 3b also weakens the interface between the starting substrate 1 and the first GaN layer 5a.

Another step consists in forming GaN islands through the mask openings 3a. The growth rate along an axis orthogonal to the main plane of the starting substrate 1 is kept higher than the lateral growth rate. This results in islands or strips with triangular cross-sections (depending on the shape of the openings 3a). Within these strips with triangular cross-sections, the through dislocations are bent at 90°.

Lateral overgrowth is then performed to finally result in a planar ELO layer. At the end of this step of the process, a first GaN layer 5a with a dislocation density of less than $10^7$ cm$^{-2}$ is obtained.

1.1.2. Second Variant of Lateral Overgrowth

In a second embodiment, the growth phase 10 consists of a universal lateral overgrowth (hereinafter ULO) as described in document EP 1 977 028.

The ULO comprises a step of depositing a nucleation layer on the starting substrate 1.

The nucleation layer is, for example, a very thin film of silicon nitride SiN, of the order of a few atomic planes, i.e., of the order of 10 nm to 20 nm thick. The deposition of SiN based on silane and ammonia can last 360 seconds.

A continuous buffer layer 2—for example of GaN—is then deposited on the nucleation layer. The deposition of the GaN buffer layer 2 filters out crystal defects and thus minimizes from the beginning of the process the density of defects that will be present in the first epitaxial GaN layer 5a subsequently.

The thickness of this GaN buffer layer 2 can be comprised between 10 and 100 nm. The temperature during this operation can be comprised between 500 and 700° C.

An annealing at high temperature comprised between 900 and 1150° C. is then carried out. Under the combined effect of the temperature increase, the presence of a sufficient amount of hydrogen in the gaseous carrier and the presence of the very thin SiN film, the morphology of the GaN buffer layer 2 undergoes a deep modification resulting from a solid phase recrystallization by mass transport. The initially continuous GaN buffer layer 2 is then converted into a discontinuous layer of GaN patterns. GaN patterns or islands which have very good crystalline quality and maintain an epitaxial relationship with the starting substrate thanks to the very small thickness of the nucleation layer are thus obtained.

The areas where the silicon nitride SiN is exposed then function as a mask and the GaN patterns function as the GaN areas located in the openings made ex situ in the mask. Lateral overgrowth is then performed to finally result in a planar ULO layer.

This method, where the silicon nitride mask forms spontaneously, and which involves the same dislocation bending mechanisms as in ELO is identified as "ULO" (or "spontaneous ELO").

1.2. Phase 20 of Forming a Separation Area 4

The process further comprises a phase 20 of forming a separation area 4.

This phase 20 of forming a separation area can be implemented according to different variants. In particular, the phase 20 of forming the separation area can be implemented:

prior to the growth phase 10 of the first GaN layer (first variant), or after the growth phase 10 of the first GaN layer (second variant), or during the growth phase 10 of the first GaN layer (third variant).

1.2.1. First Variant of Forming the Separation Area 4

In a first embodiment, the phase 20 of forming a separation area 4 may consist in depositing a sacrificial intermediate layer, prior to the phase 10 of growing the first GaN layer 5a, as described in document EP 1 699 951.

1.2.2. Second Variant of Forming the Separation Area

In a second embodiment, the phase 20 of forming a separation area 4 comprises an implantation step performed after the phase 10 of growing the first GaN layer 5a. This implantation allows the creation of an embrittled area in the first GaN layer 5a.

The implantation consists in bombarding the first GaN layer 5a with ions so as to create a layer of microcavities (or bubbles) in the semiconductor, at a depth close to the average penetration depth of these ions.

The implanted ions may be selected from tungsten, helium, neon, krypton, chromium, molybdenum, iron, hydrogen, or boron. Preferably, the implanted ions are tungsten ions. These have the specific feature of decomposing GaN.

In terms of dose, when the implanted ions are H+ ions, the implanted ion dose can be between $10^{16}$ and $10^{17}$ cm$^2$, and the implantation depth can vary between 0 nm and 50 nm starting from the free surface—called the growth face—of the first GaN layer 5a.

The implantation of embrittling ions can be implemented in a single step or in successive steps. The temperature can be between 4 K and 1400 K during the implantation step.

The implantation can be followed by an annealing phase to cure the crystal damage created during the ion implantation, this annealing can be done at a temperature comprised between 500° C. and 1500° C.

1.2.3. Third Variant of Forming the Separation Area

In a third embodiment, the separation area 4 can be formed during the growth phase 10 of the first GaN layer 5a.

In particular, when the growth phase is carried out according to the first variant embodiment known as ELO (i.e., deposition of a dielectric mask 3a, 3b), the phase 20 of forming the separation area 4 can comprise the implantation of the buffer layer 2 prior to the deposition of the mask 3a, 3b.

This allows the separation area 4 to be placed at a precisely desired depth because the first GaN layer 5a deposited in the ELO step does not "interfere" with ion implantation.

Of course, implantation can be carried out at different stages of the ELO (or ULO) phase, either within the islands, at an intermediate stage where the islands are not fully coalesced, or after total island coalescence.

1.3. Epitaxy Resumption Phase 30

At the end of the phases 20 of forming a separation area 4 and growth 10 of the first GaN layer 5a, the process includes an epitaxy resumption phase 30 to form a thick layer of GaN 5b.

The process can also be started directly at this phase 30, by forming a thick layer of GaN 5b, the phases of growth 10, and of forming the separation area 20 being optional. Hereinbelow, it is considered that these phases 10 and 20 are applied.

This epitaxial resumption can be implemented by:
metalorganic vapor phase epitaxy (MOVPE);
hydride vapor phase epitaxy (HVPE);
closed-space vapor transport (CSVT); or by
liquid phase epitaxy (LPE).

During this step it is preferred to use the HVPE technology, which allows three main advantageous effects to be obtained:

A first effect is that the first GaN layer 5a is thickened without losing its crystalline qualities (no new dislocation or crack is generated).

A second effect is that the dislocation density is further reduced by a factor of at least 2 during HVPE, beyond 100 µm of GaN growth (0001) (ref https://doi.org/10.1143/APEX.5.095503).

A third effect is that the thick layer of GaN 5 thus obtained may in some cases allow spontaneous separation from its starting substrate 1 at the separation area 4 in case of sublimation or mechanical fracture of said area during HVPE growth.

More precisely, the resumption is performed according to the following process: the temperature rise is performed in a mixed atmosphere of nitrogen and ammonia and hydrogen. Once a stable temperature of about 1000° C. is reached, the growth phase of a thick layer of GaN is then initiated by introducing into the vapor phase gallium chloride (GaCl) obtained by reacting HCl with liquid gallium maintained at a temperature of at least 800° C. The GaCl and ammonia are partially pyrolyzed in the growth chamber whose temperature is maintained at about 1000° C. Thus, a single-crystal GaN deposit is gradually formed at the nucleation substrate level (formed during the first growth phase).

It is necessary to obtain a GaN film that is sufficiently thick, and therefore sufficiently resistant from a mechanical point of view, to avoid the fracture of the GaN layer into small pieces during the separation and to facilitate its handling without risk of breakage. The growth continues for several hours under these experimental conditions in order to reach a thickness of at least 200 microns of the GaN layer and preferably a thickness greater than 1 mm.

The growth is then definitively completed by diverting the flow of HCl to the outside and the cooling takes place in an atmosphere consisting of nitrogen and ammonia.

The growth conditions of this second single-crystal layer 5b are typically a growth temperature comprised between 900 and 1200° C., with a growth rate that can be between 50 and 500 micrometers/h, preferably between 70 and 200 micrometers/h.

The raw self-supported GaN crystal thus obtained has a thickness greater than 200 µm and preferentially greater than 1 mm. Its maximum thickness is less than 10 mm or even less than 5 mm.

The diameter of the raw self-supported GaN crystal thus obtained has a diameter greater than 50 mm and preferentially a diameter greater than 100 mm. Its maximum diameter is less than 250 mm or even less than 200 mm.

Under these conditions, the doping is carried out by adding the n-doping element according to the following process:

Oxygen supply and concentration are controlled by controlling the purity of the group III precursor and by carrying out very thorough purges of the reactor before growth under vacuum at a residual pressure lower than 500 Torr.

For germanium: from a solid source, $GeCl_4$, germane, tetramethylgermanium and isobutylgermane as well as derivatives thereof. These dopant gases are then vaporized in the reaction chamber. Preferably, these dopant gases can be previously mixed in vapor phase with the GaCl flow to improve the homogeneous distribution of the doping flow in the growth chamber.

In the case of a gaseous precursor, the gas tank is maintained at a pressure comprised between 1 bar and 3 bar and a flow of carrier gas ($N_2$ and/or $H_2$) with a flow rate comprised between 0.25 sccm and 20 sccm is applied.

For silicon, from silane, dichlorosilane, silicon tetrachloride, as well as derivatives thereof which are vaporized in the reaction chamber. In the case of dichlorosilane (1% diluted in 99% $N_2$ (or $H_2$) a flow comprised between 1 and 20 sccm is applied. Preferably these dopant gases can be mixed in vapor phase with the GaCl flow to improve the homogeneous distribution of the doping flow in the growth chamber.

Silicon and germanium can be introduced together, leading to a 3-dopant system.

1.4. Separation Phase 40

A separation phase 40 is also implemented, which is dependent on the variant implemented for the phase 20 of forming the separation area 4.

In the case of ion implantation, the spontaneous separation phase 40 takes place due to the thermal cycle (high-temperature epitaxial resumption and cooling) that the thickened GaN layer 5 undergoes, which, due to the difference in thermal expansion coefficients between the starting substrate 1 and the thickened GaN layer 5, generates stresses causing its separation.

In the case of the deposition of a sacrificial intermediate layer, this separation takes place during the epitaxy by spontaneous vaporization of the intermediate layer or by mechanical fracture at the level of the so-called sacrificial layer.

In the case of post-growth separation, a laser can be used to vaporize the sacrificial layer.

Figure 3:
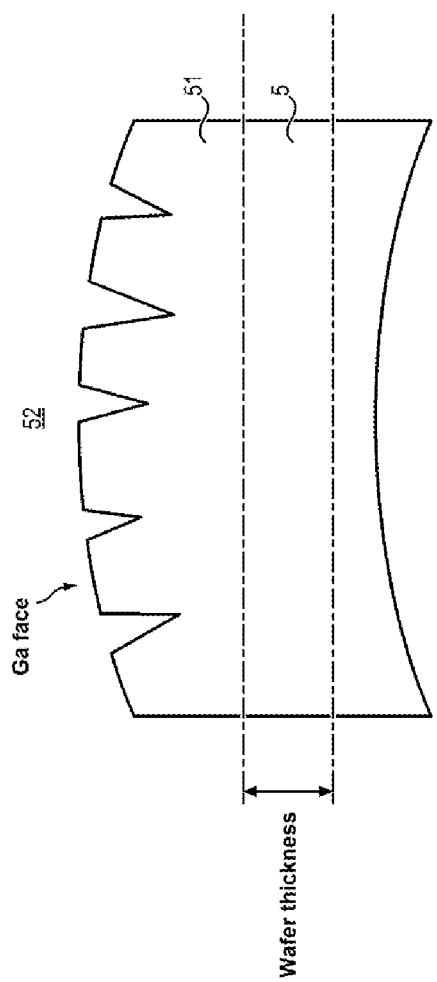
FIG. 3 illustrates the grinding and finishing steps according to a possible embodiment of the invention.

A self-supported GaN crystal 5 as shown in FIG. 3 is obtained.

As is common in HVPE, the GaN crystal 5 includes protrusions 51 in the form of hexagonal pyramids on a front face 52.

Such a crystal, illustrated in FIG. 3, is curved and has a radius of curvature of less than 25 meters and preferably less than 20 meters (radius of curvature of the front face 52, as well as of the face of the crystal opposite to said front face 52).

In the example of FIG. 3, this radius of curvature is 5 meters or more; furthermore, the crystal 5 has a through dislocation density $10^7$ $cm^{-2}$ or less, preferably less than $5 \times 10^6$ $cm^{-2}$.

The GaN crystal 5, having been formed on a starting substrate with a non-zero truncation angle, also has a non-zero truncation angle, with the orientation of the crystal planes propagating from one layer to the next. For example, in the case of a sapphire substrate 1 with a truncation angle of 4 degrees, the growth face of the crystal 5 has a truncation angle of 4 degrees, preferably comprised between 0.1 and 1 degree over its entire surface.

1.5. Rectification Phase 45

Once the GaN crystal 5 is separated from the starting substrate 1, it is ground. Current techniques allow the removal of a layer thickness to be controlled to within 10 micrometers.

1.6. Finishing Phase 50

The finishing operation is then carried out to form GaN wafers.

The back side and the sides or edges of the insert are ground and polished to a surface finish acceptable for the application.

Thus, the proposed process is particularly suitable for the fabrication of wafers of semiconductor material, in particular wafers of material of elements of groups 13 and 15 of the periodic table, more particularly wafers composed of group 13 nitride, preferably GaN, of large diameter, greater than 50 mm, moreover 100 mm or even 150 to 200 mm.

The wafer of semiconductor material according to FIG. 3, formed according to the process of the invention, has a thickness of 200 to 2000 micrometers and an excellent crystal quality such that the width at half-height of the X-ray diffraction (XRD) peak of the (002) line around the angle ω in symmetrical condition of the GaN films (0001) is less than 130 arcsec.

According to another possible process, by way of illustration and in contrast to the previously described process, the single-crystal material according to the invention is obtained by growth on a starting substrate or seed, for example sapphire, on which a layer of GaN nitride has preferably been deposited beforehand, preferably of at least a few micrometers and less than 10 micrometers. The growth is performed in an HVPE type reactor. The epitaxial deposition is carried out under the same conditions as the phase 30 described above but continued over a longer period of time in order to form a layer of several mm.

The crystal undergoes a trimming operation and then is cut into several wafers typically 100 to 600 micrometers thick using either a loose wire saw (abrasive particles in a slurry that impregnates the wire before cutting) or a fixed wire saw (abrasive particles previously fixed on the wire). The finishing steps (grinding, polishing) are similar to the process described above.

In Example 3 (according to the invention), unlike the previous example, germanium is also introduced in the form of $GeCl_4$ at a flow of 2 sccm in order to allow the co-doping of the GaN material, until the end of the HVPE growth.

From targeted SIMS measurements in the basal faceted areas (0001) and in the non-basal areas, we were able to estimate the respective amount of incorporated atoms. For this purpose, an ion beam is applied to the surface in order to locally ionize a part of the material. This makes it possible to analyze the atoms that compose it (alloying, doping or impurities). A measurement line is carried out on a length of approximately 0.9 mm. The selected incident ion beam allows the analysis of the composition of the material in a circle of about 10 μm in diameter and about 1 μm in depth. Each crater (or point of impact of the beam) of the line is spaced of approximately 50 μm.

Using this protocol and due to the density of GaN areas resulting from basal facet growth compared with GaN areas resulting from non-basal facet growth, at least one SIMS measurement is performed in a GaN area resulting from basal facet growth (0001). Once the measurements are made, the analyzed area is imaged by cathodoluminescence in order to definitely attribute the SIMS measurements to the different GaN areas.

In addition, the free carrier density and average resistivity of the GaN layer measured by the Van der Pauw method are also presented in the following Table 1:

TABLE 1

Table 1: SIMS measurements performed on NID (or non-doped), O-doped and O + Ge-doped samples: LOD = limit of detection (6 * $10^{15}$ cm$^{-3}$)

| Examples | Density of free carriers in the center (type n in $10^{18}$ cm$^{-3}$) | Resistivity in mohm · cm | Concentration of oxygen atoms $10^{17}$ cm$^{-3}$ in the non-basal facets | Concentration of oxygen atoms $10^{17}$ cm$^{-3}$ in the basal or (0001) facets | Concentration of Ge atoms $10^{17}$ cm$^{-3}$ in the non-basal facets | Concentration of Ge atoms $10^{17}$ cm$^{-3}$ in the basal or (0001) facets | Concentration of Si atoms $10^{17}$ cm$^{-3}$ in the non-basal facets | Concentration of Si atoms $10^{17}$ cm$^{-3}$ in the basal or (0001) facets | XRD quality crystal | Density of macro-inclusions Number/cm$^2$ (of surface Ga) |
|---|---|---|---|---|---|---|---|---|---|---|
| 1 "NID" doping | 0.28 | 66 | 3.10 | ≤1.0 | <6E+15 | <6E+15 | <1 | <1 | 110 | <1 |
| 2 O doping | 1.60 | 20 | 12.0 | ≤3.0 | <6E+15 | <6E+15 | <1 | <1 | 107 | <1 |
| 3 Ge + O co-doping | 1.48 | 17 | 5.00 | ≤3.0 | 11.0 | 9.7 | <1 | <1 | 105 | 1 |

The present invention and its advantages are illustrated by the following examples. The examples according to the invention should not be considered as limiting its implementation.

Example Embodiments

In Example 1 (comparative) GaN growth is performed by HVPE on the basis of a substrate as described for example by WO/03100839A2 according to substrate according to the process described for example by the publication preferably incorporated WO/03100839A2 in step (iii). The (volume) flow ratio of $N_2/(N_2+H_2)$ is 0.2. Furthermore, in the present case, the growth temperature is maintained at 930° C. The structure of the growth front FC observed by scanning electron microscope is shown in FIGS. 4a and 4b.

Figure 4C:
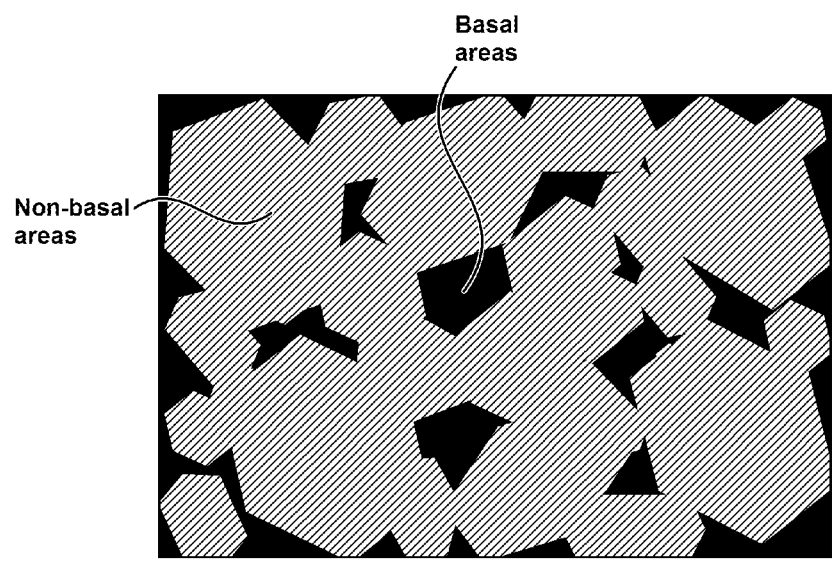
FIG. 4c depicts the structure of a wafer according to the invention, after grinding and polishing, showing first areas resulting from the growth of non-basal facets with areas resulting from the growth of basal facets.

FIG. 4c depicts the structure of a wafer according to the invention, after grinding and polishing, showing first areas resulting from the growth of non-basal facets with areas resulting from the growth of basal facets.

In Example 2 (comparative), unlike the previous example, during the HVPE growth phase in step 30 as depicted in FIG. 1, oxygen is introduced in the gas phase (for example 1% $O_2$ diluted in 99% $N_2$ flow sent between 0.2 sccm and 10 sccm) in order to introduce an n-type doping in the GaN material.

Table 1: SIMS measurements performed on NID (or non-doped), O-doped and O+Ge-doped samples; LOD=limit of detection (6*$10^{15}$ cm$^{-3}$)

The XRD crystal quality is determined by measuring the width at half-height of the X-ray diffraction peak of the (002) line around the angle ω in symmetrical condition of the (0001) GaN planes.

It is observed that the amount of oxygen elements in the (0001) facets increases only slightly with the doping unlike that of the non-basal 3D growth areas.

When the germanium element is introduced, the concentration of Ge obtained is similar in the growth areas from the (0001) facets compared with the growth areas from the non-basal facets.

Examples 2 and 3 have similar properties on average (free carrier density and resistivity) and improved compared with Example 1, but Example 3 according to the invention shows a much more homogeneous distribution of dopants while presenting a quite satisfactory crystalline quality and an acceptable surface density of macro-inclusions.

Also, according to the inventors' experiments, the minimum concentration of Ge or Si atoms in the faceted area (0001) is preferably higher than 1.0×$10^{17}$ atoms/cm$^3$ and the maximum concentration of O atoms in the areas resulting from the growth of the non-basal facets is preferably lower than $2.0\times10^{18}$ atoms/cm$^3$. It is thus possible to reach an average resistivity of the GaN layer lower than 25 mohm·cm, or even lower than 20 mohm·cm, while keeping a cumulative concentration of O, Si and Ge atoms lower than $1.0\times10^{19}$ atoms/cm$^3$ of the crystal in the 2 domains. Also, the concentration of Ge+Si atoms can be higher than $2.0\times10^{17}$ atoms/cm$^3$, preferentially higher than $8.0\times10^{17}$ atoms/cm$^3$. Furthermore, the concentration of O atoms can be preferentially less than $1.0\times10^{18}$ atoms/cm$^3$.

Raman measurements were also performed on the areas resulting from facet growth (0001) using a Thermo DXRxi Raman spectrometer. This spectrometer is dedicated to fast Raman imaging with a maximum acquisition capacity of 600 spectra/s. In one configuration, the analysis is performed with a 532 nm laser of 10 mW power. The laser beam is focused on the sample through a microscope offering a 50× magnification level.

It is known that the variation of free carrier density influences the position of the A1(LO) peak in the Raman spectrum of GaN. As the wavenumber increases, the sample has a higher free carrier density. FIGS. 5a and 5b show the variation of the position of the A1(LO) peak as a function of the doping rate linked to the GeCl$_4$ flow rate. It is noteworthy that when the doping is done only by oxygen, the position of the A1(LO) peak in the faceted areas (0001) does not vary, it can therefore be estimated that the density of free carriers in these areas is similar to that of a sample without intentional doping. When the doping is done in a mixed way (in this case germanium+oxygen), the position of the peak varies, which indicates an increase in the number of free carriers in the faceted areas (0001). Thus, the single-crystal of Example 3 according to the invention has a Raman peak A1(LO)>734 cm$^{-1}$ over its entire surface.

Figure 6:
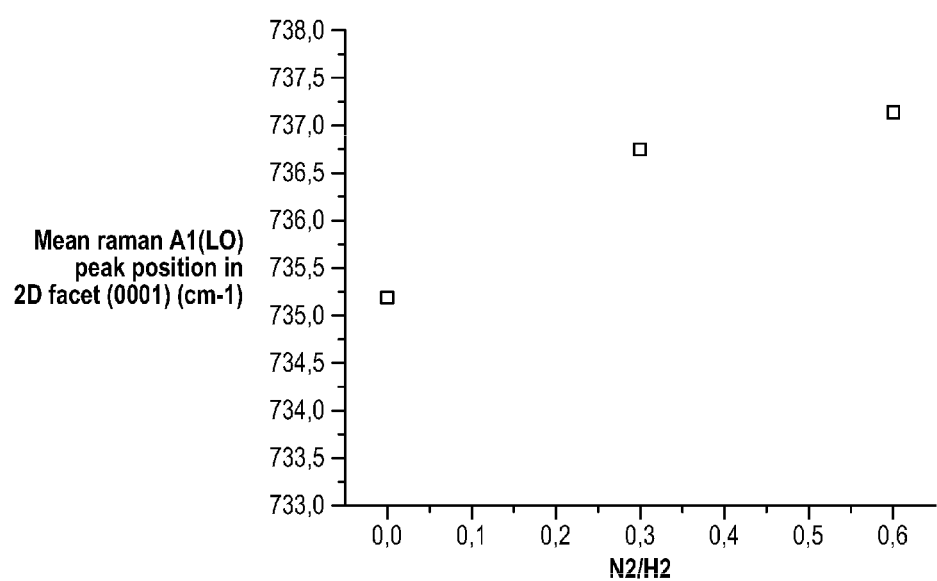
FIG. 6 shows the average variation of the Raman peak A1(LO) on the faceted (0001) regions of a growth front of a GaN material by HVPE in 3D mode as a function of the volume flow rate ratio $N_2/(N_2+H_2)$ during growth.

Example 4 and FIG. 6 show that increasing the N$_2$/(N$_2$+H$_2$) volume flow ratio in the reaction chamber increases the doping in the areas resulting from facet growth (0001).

Thus, the invention allows basal (0001) and non-basal facets to coexist within the same three-dimensional growth front during the HVPE growth of GaN, while having more homogeneous optical and electrical properties than with a simple oxygen doping after shaping the GaN layer and obtaining a two-dimensional surface.

The advantage of the increased homogeneity of the material properties is to improve the current distribution in LEDs, lasers and power transistors made from our product. For optical applications, it also leads to improved homogeneity of the absorption of the GaN layer.

Both of these advantages are beneficial when fabricating devices, as the latter do not have significant variation in their characteristics within the same wafer.

The invention claimed is:

1. A process for fabricating a single-crystal semiconductor material of group 13 nitride, in particular GaN, comprising the steps of:
   deposition of at least one single-crystal layer by three-dimensional epitaxial growth on a starting substrate, said layer comprising areas resulting from the growth of basal facets, having facets perpendicular to the direction of the growth front formed by the basal plane (0001), and areas resulting from the growth of facets of different orientations, called non-basal facets, having facets which are non-perpendicular to the direction of the growth front;
   supply of a n-dopant gas comprising a first chemical element selected from the chemical elements of group 16 of the periodic table, and at least one second chemical element selected from the chemical elements of group 14 of the periodic table, such that the concentration of the second element in the areas resulting from the growth of the basal facets is higher than $1.0\times10^{17}$/cm$^3$, and the concentration of the first element in the areas resulting from the growth of the non-basal facets is lower than $2.0\times10^{18}$/cm$^3$,
   wherein the semiconductor material has an atomic ratio (silicon+germanium)/oxygen comprised between 0.5 and 5.

2. The fabrication process as claimed in claim 1, wherein the second chemical element of the n-dopant gas is germanium, formed from a solid source, GeCl$_4$, germane, tetramethylgermanium and isobutylgermane as well as derivatives thereof, and/or, the second chemical element of the n-dopant gas is silicon, formed from a solid source, silane, dichlorosilane, silicon tetrachloride, as well as derivatives thereof.

3. The fabrication process as claimed in claim 1, wherein the first chemical element of the n-dopant gas is oxygen.

4. The fabrication process as claimed in claim 1, wherein the n-dopant gas is mixed in vapor phase with a gallium chloride gas stream.

5. The fabrication process as claimed in claim 1, wherein the epitaxial growth is implemented by HVPE at a growth rate lower than 450 μm/h.

6. A process for fabricating a semiconductor substrate of group 13 nitride, in particular GaN, comprising the steps of:
   fabricating a single-crystal semiconductor material of group 13 nitride on a starting substrate as claimed in claim 1,
   separating the single-crystal material from the starting substrate;
   rectifying by eliminating the thickness of the single-crystal semiconductor material in order to obtain a group 13 nitride wafer with a thickness comprised between 250 μm and 2000 μm.

7. A two-dimensional group 13 nitride wafer, in particular of GaN, obtained by three-dimensional epitaxial growth, comprising areas resulting from the growth of basal facets, i.e., having facets perpendicular to the direction of the growth front formed by the basal plane (0001), and areas resulting from the growth of facets of different orientations, known as non-basal facets, i.e., having facets which are non-perpendicular with respect to the direction of the growth front, wherein:
   the areas resulting from the growth of non-basal facets comprise a first chemical element selected from the chemical elements of group 16 of the periodic table, the concentration of which is less than $2.0\times10^{18}$/cm$^3$,
   the areas resulting from the growth of basal facets comprise at least one second chemical element selected from the chemical elements of group 14 of the periodic table, the concentration of which is greater than $1.0\times10^{17}$/cm$^3$, and
   the wafer has an atomic ratio (silicon+germanium)/oxygen comprised between 0.5 and 5.

8. The two-dimensional group 13 nitride wafer as claimed in claim 7, wherein the concentration of the second element in the areas resulting from basal facet growth is greater than $2.0\times10^{17}$/cm$^3$, and the concentration of the first element in the areas resulting from non-basal facet growth is less than $1.0\times10^{18}$/cm$^3$.

9. The two-dimensional group 13 nitride wafer as claimed in claim 7, wherein the cumulative concentration of the first and second chemical elements is less than $2.0\times10^{19}$/cm$^3$.

10. The two-dimensional group 13 nitride wafer as claimed in claim 7, wherein the second chemical element is germanium and/or silicon.

11. The two-dimensional group 13 nitride wafer as claimed in claim 7, wherein the basal facet growth areas represent less than 60% and preferentially from 5% to 25% of the upper surface of the wafer.

12. The two-dimensional group 13 nitride wafer as claimed in claim 7, wherein the crystal quality measured by the width at half-height of the X-ray diffraction (XRD) peak of the line (002) around the angle ω in symmetrical condition of the GaN planes (0001) less than 130 arcsec, preferably less than 100 arcsec, more preferably less than 90 arcsec, or even less than 60 arcsec, and the width at half-height of the X-ray diffraction (XRD) peak of the 201 line around the angle ω in oblique condition of the GaN films (0001) less than 240 arcsec, preferably less than 140 arcsec, or even less than 100 arcsec.

13. The group 13 or III nitride wafer as claimed in claim 7, wherein the wafer material has an average electrical resistivity of less than 25 mohm-cm.

14. Use of a group 13 or III nitride wafer as claimed in claim 7 as a substrate for the fabrication of optoelectronic components, such as light-emitting diodes, laser diodes, vertical transistors for power electronics, horizontal transistors for power electronics or telecommunications (radio frequency), current rectifier diodes or sensors.

* * * * *